United States Patent
Bravo et al.

(10) Patent No.: US 7,562,779 B2
(45) Date of Patent: Jul. 21, 2009

(54) CABLE MANAGEMENT RACK WITH PASS-THROUGH TRAY

(75) Inventors: Rey Bravo, Mokena, IL (US); Richard D. Cozad, Orland Park, IL (US); Alan F. Wojcik, Calumet City, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 10/820,986

(22) Filed: Apr. 8, 2004

(65) Prior Publication Data

US 2004/0201975 A1    Oct. 14, 2004

Related U.S. Application Data

(60) Provisional application No. 60/461,936, filed on Apr. 10, 2003.

(51) Int. Cl.
    G02B 6/00    (2006.01)
    A47F 5/00    (2006.01)
(52) U.S. Cl. .......................... 211/26; 361/826; 385/135
(58) Field of Classification Search ................... 211/26, 211/85.5, 126.1, 133.4; 385/135; 174/50, 174/65 R; 361/826, 827, 829; 312/223.6, 312/223.1; 242/407, 400.1
    See application file for complete search history.

(56) References Cited

U.S. PATENT DOCUMENTS

| | | | |
|---|---|---|---|
| 4,792,203 A * | 12/1988 | Nelson et al. ............... 385/135 |
| 5,402,515 A | 3/1995 | Vidacovich et al. |
| 5,640,482 A | 6/1997 | Barry et al. |
| 5,758,003 A * | 5/1998 | Wheeler et al. ............. 385/134 |
| 5,937,131 A * | 8/1999 | Haataja et al. .............. 385/136 |
| 6,181,862 B1 | 1/2001 | Noble et al. |
| 6,250,816 B1 * | 6/2001 | Johnston et al. ............... 385/53 |
| 6,256,444 B1 * | 7/2001 | Bechamps et al. .......... 385/134 |
| 6,365,834 B1 * | 4/2002 | Larsen et al. ................ 174/100 |
| 6,468,112 B1 | 10/2002 | Follingstad et al. |
| 6,493,498 B1 | 12/2002 | Colombo et al. |
| 6,504,986 B1 * | 1/2003 | Wambeke et al. ........... 385/134 |
| 6,532,332 B2 | 3/2003 | Solheid et al. |
| 6,535,682 B1 | 3/2003 | Puetz et al. |
| 6,541,705 B1 * | 4/2003 | McGrath .................. 174/99 R |
| 6,614,978 B1 * | 9/2003 | Caveney ..................... 385/135 |
| 6,631,875 B1 * | 10/2003 | Kampf et al. ............... 248/68.1 |
| 6,633,717 B1 * | 10/2003 | Knight et al. ............... 385/135 |
| 6,715,619 B2 * | 4/2004 | Kim et al. ..................... 211/26 |

(Continued)

OTHER PUBLICATIONS

Fiber Cable Management Products (Second Edition) ADC Telecommunications.

Primary Examiner—James Kramer
Assistant Examiner—Jared W. Newton
(74) Attorney, Agent, or Firm—Robert A. McCann; Zachary J. Smolinski; Christopher K. Marlow (57) ABSTRACT

A cable management rack for routing cables thereon. The rack has a front side and a rear side. The rack includes a frame, first and second frame-mountable components, each of the components having a plurality of ports configured for receiving an end of one of the cables therein, and a frame-mountable pass-through tray disposed on the frame between the first and second components, the pass-through tray for routing the cables between the front side of the rack and the rear side of the rack.

19 Claims, 14 Drawing Sheets

U.S. PATENT DOCUMENTS

| | | | |
|---|---|---|---|
| 6,748,155 B2 * | 6/2004 | Kim et al. | 385/135 |
| 6,819,857 B2 * | 11/2004 | Douglas et al. | 385/135 |
| 6,850,685 B2 * | 2/2005 | Tinucci et al. | 385/134 |
| 6,944,383 B1 * | 9/2005 | Herzog et al. | 385/123 |
| 7,006,748 B2 * | 2/2006 | Dagley et al. | 385/134 |
| 7,079,745 B1 * | 7/2006 | Weinert et al. | 385/135 |
| 7,083,051 B2 * | 8/2006 | Smith et al. | 211/26 |
| 2002/0170726 A1 * | 11/2002 | Mendoza | 174/15.2 |
| 2002/0176681 A1 * | 11/2002 | Puetz et al. | 385/134 |
| 2004/0037533 A1 * | 2/2004 | Knudsen | 385/135 |

* cited by examiner

CABLE MANAGEMENT RACK WITH PASS-THROUGH TRAY

CROSS-REFERENCE TO RELATED APPLICATION

This application claims priority to U.S. Provisional Application Ser. No. 60/461,936, filed on Apr. 10, 2003, the entirety of which is hereby incorporated by reference.

BACKGROUND OF THE INVENTION

Fiber optic networks, renowned for their superior data transfer rates, are becoming increasingly commonplace within all sorts of businesses, and are virtually ubiquitous in many telecommunications centers. As such communications systems continue to proliferate, with larger and denser network configurations increasingly required, the ability to efficiently reconfigure these systems by disconnecting and reconnecting various fiber optic cables and connectors becomes paramount, yet increasingly difficult.

A key objective in designing a network is to strategically place most or all of the routing-determinative connective hardware within a single location so as to increase the efficiency of reconfiguring routing and communications connections. This purpose is being significantly thwarted by the exponential growth in the number of cord connections between respective patch panels, communication switches, equipment, etc., to maintain appropriate network functionality. The incidence of "spaghetti" cabling, a term colorfully describing a dense, chaotic arrangement of cables and the resultant difficulty of tracing the path of a single cable, has become frequent on densely populated network racks, and has become virtually omnipresent where multiple densely populated racks in close proximity to one another have many interrack port-to-port connections.

Further complicating the routing is the fact that fiber optic cables are well-known for their heightened care requirements. In particular, a minimum bend radius must be maintained along the length of a fiber optic cable to protect the glass core. For some network racks, for example, Telecordia generally requires a minimum 1.5" bend radius throughout. As the number and weight of the cables on a rack and extending between racks grows, so too does the need for better strain relief, bend radius protection, and slack management.

Routing cables between racks in a multiple-rack network configuration presents special concerns. It is often preferred to route the cables behind the racks so that the mass of cabling does not hinder access to the front of the rack and the ports of the patch panels and other equipment thereon. Thus, it is desirable to provide, within the prescribed Telecordia GR-449-CORE footprint and other requirements, a system of cable management racks that efficiently routes cable between particular racks in the system.

SUMMARY OF THE INVENTION

According to one embodiment of the present invention, there is provided an inventive rack-mountable pass-through tray and cable management rack including such a tray, and a method of routing cables using such a tray and rack.

In a first embodiment of the invention, there is provided a cable management rack for routing cables thereon. The rack has a front side and a rear side. The rack includes a frame, first and second frame-mountable components, each of the components having a plurality of ports configured for receiving an end of one of the cables therein, and a frame-mountable pass-through tray disposed on the frame between the first and second components, the pass-through tray for routing the cables between the front side of the rack and the rear side of the rack.

In another embodiment of the invention, there is provided a pass-through tray mountable to a cable management rack having front and rear sides between a pair of rack-mountable components, the pass-through tray for routing cables between the front side of the rack and the rear side of the rack. The tray includes a base for supporting the cables thereon, and at least one mounting portion extending generally from the base for permitting the tray to be mounted to the rack.

In yet another embodiment of the invention, there is provided a method for routing a cable having first and second ends from a first cable management rack to a second cable management rack. Each of the racks has at least one cable end-receiving port thereon on a front side thereof, and each of the racks additionally has a rear side. Each of the racks has a rack-mounted pass-through tray mounted thereon at approximately the same elevation. The second rack includes a rear vertical elevator and a slack manager. Each of the pass-through trays includes a rear channel, and the tray on the second rack includes a waterfall portion. The method includes the steps of inserting the first end of the cable into the port on the first cable management rack, routing the cable generally transversely over a fan at approximately the same elevation as the port on the first cable management rack, routing the cable vertically to a rack-mounted pass-through tray, routing the cable through the pass-through tray from the front side of the first rack to the rear side of the first rack, routing the cable into the rear channel of the tray on the first rack, routing the cable transversely through the rear channel of the tray on the first rack, routing the cable transversely from the rear channel of the tray on the first rack to the rear channel on the tray on the second rack, routing the cable through the waterfall portion of the rear channel on the second rack, routing the cable from the waterfall portion to the rear vertical elevator of the second rack, routing the cable from the rear vertical elevator to the slack manager of the second rack, routing the cable from the slack manager of the second rack up to a fan at approximately the same elevation as the port on the second cable management rack, routing the cable over the fan to the port on the second cable management rack, and inserting the second end of the cable into the port on the second cable management rack.

In still another embodiment of the invention, there is provided a multiple-rack system of cable management racks for routing cables thereon and therebetween, at least one of the racks having a front side and a rear side. The one rack includes a frame, first and second frame-mountable components, each of the components having a plurality of ports configured for receiving an end of one of the cables therein, and a frame-mountable pass-through tray disposed on the frame between the first and second components, the pass-through tray for routing the cables between the front side of the one rack and the rear side of the one rack.

DETAILED DESCRIPTION OF PREFERRED EMBODIMENTS

The invention pertains generally to routing elements on cable management racks, and more particularly to efficient routing of cables between front and rear sides of a cable management rack. Described and claimed below is a pass-through tray for cables on a cable management rack residing in a system of such racks. In preferred embodiments, the pass-through tray facilitates the routing of cables between the front and rear sides of an individual rack and from rack to rack within the system.

The embodiments shown and described may be adapted to Telecordia's GR-449-CORE general requirements for a high-density optical fiber distribution frame, such as including minimum 1.5 inch bend radius throughout, including six rear troughs disposed at predefined heights at the rear of the rack.

Figure 1:
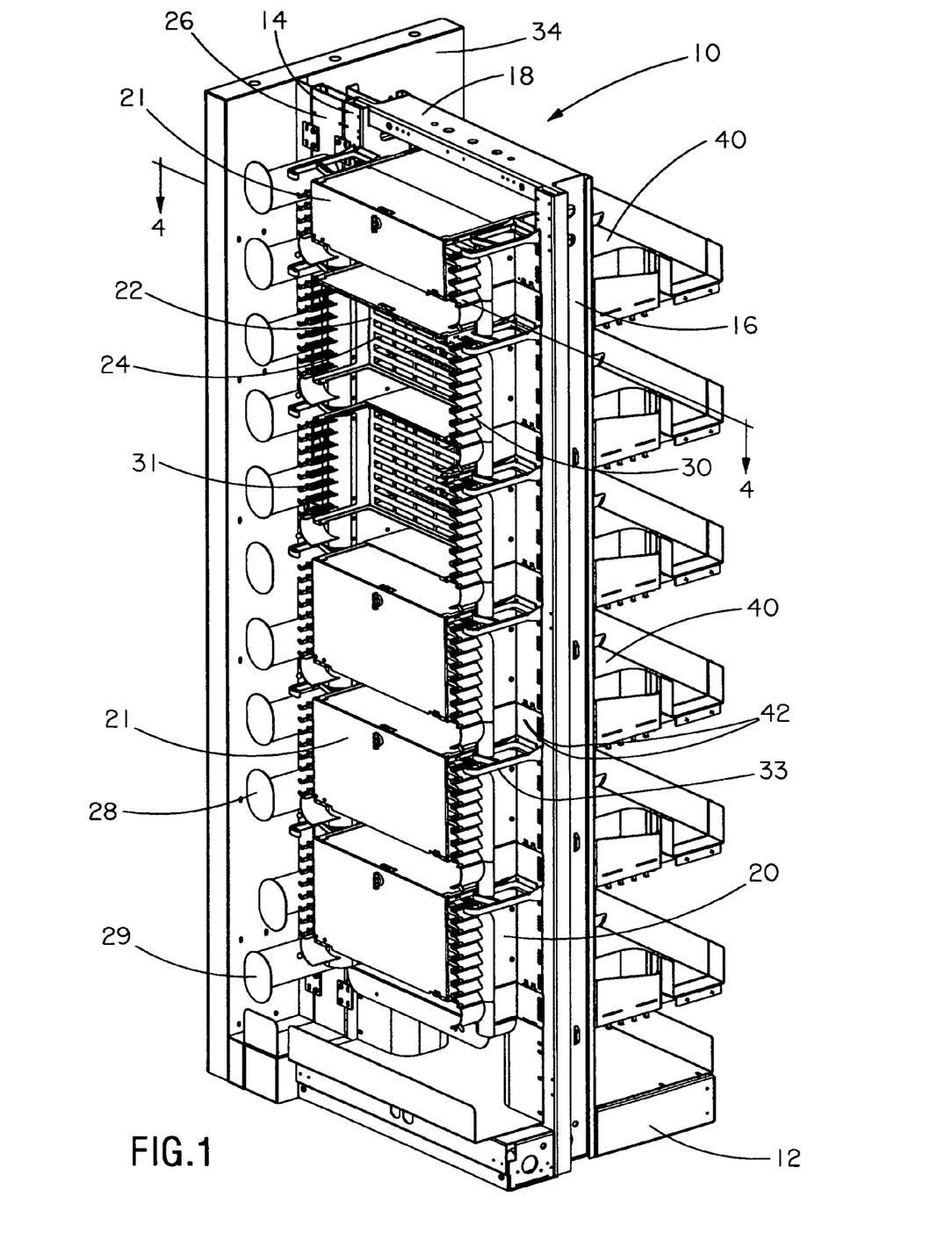
FIG. 1 is an upper right front perspective view of a cable management rack in accordance with an embodiment of the invention.
Figure 2:
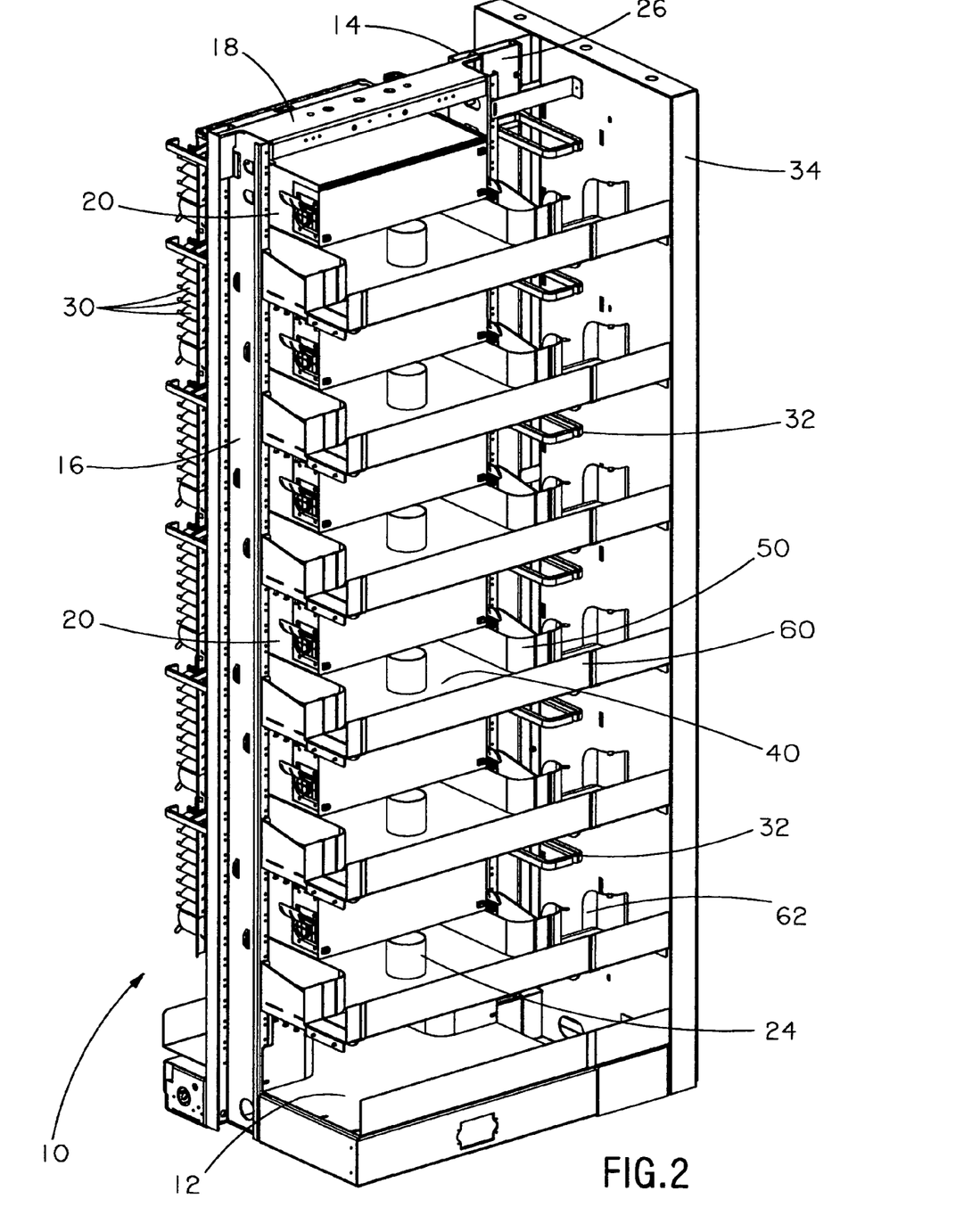
FIG. 2 is an upper right rear perspective view of the rack of FIG. 1.

As seen in FIGS. 1 and 2, the rack 10 has a base 12 for resting on a flat surface and supporting the rack, left and right vertical side rails 14 and 16, respectively, extending upwardly from the base and for supporting equipment therebetween, and a top support 18 connecting the vertical side rails 14 and 16 at their ends remote from the base.

Figure 9:
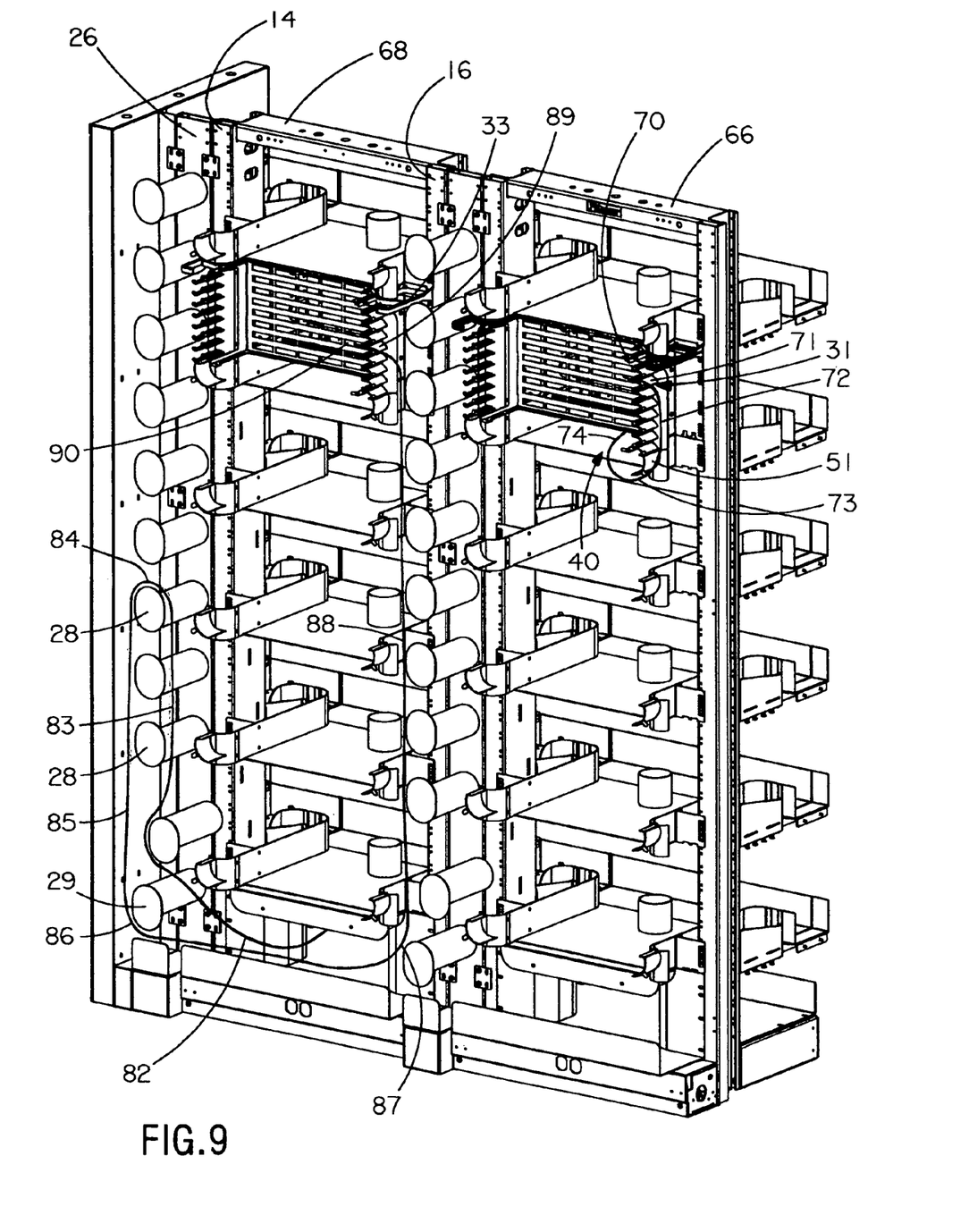
FIG. 9 is a view akin to FIG. 7 wherein some enclosure covers have been removed and a typical cable path is shown.

Enclosures 20 are preferably horizontally mounted into holes of equal height in the vertical side rails, and preferably include rotatable and slidable covers 21. The enclosures generally protect internally disposed equipment, such as patch panels 22 having a number of ports 24 thereon. Along at least one vertical side rail, there is preferably a slack manager 26 preferably having a number of spools 28 thereon at different elevations. By having slack run up from the base to the spool at the appropriate elevation, the slack is conveniently managed. A bottom spool 29 having special function described below and shown in FIG. 9 is preferably included. Cables extending from a port 24 are preferably routed over a fan 30 at a comparable level to the port to change the direction of routing from outwardly to downwardly (or upwardly to inwardly, depending on which direction one is tracing the cable) and to simultaneously provide bend radius control. Because cables are segregated according to port elevation in this manner, the propensity for cable congestion is diminished. The preferable presence of finger holes 31 further separates and organizes the cables by permitting single cables to be retained therein upon the bend radius control surfaces of the respective fans 30. On the rear side of the slack manager 26 is preferably a vertical cable routing pathway (vertical rear elevator) defined by cable-routing elements, such as rear D-rings 32. Additionally, while it may not be designed to fit the Telecordia prescribed footprint, a rack 10 may include an end cap 34 along either side thereof rather than an adjacent rack.

To facilitate routing cables from the front of the rack to the rear of the rack (or vice-versa), while simultaneously diminishing routing congestion, especially in the vertical pathways and near the base, a rack-mountable pass-through tray 40 may be mounted to the rack between other pieces of equipment mounted on the rack. For example, the tray may be mounted directly below a patch panel so that cables accessing the ports of the patch panel may be directed toward the back of the rack by passing through the tray.

Figure 3:
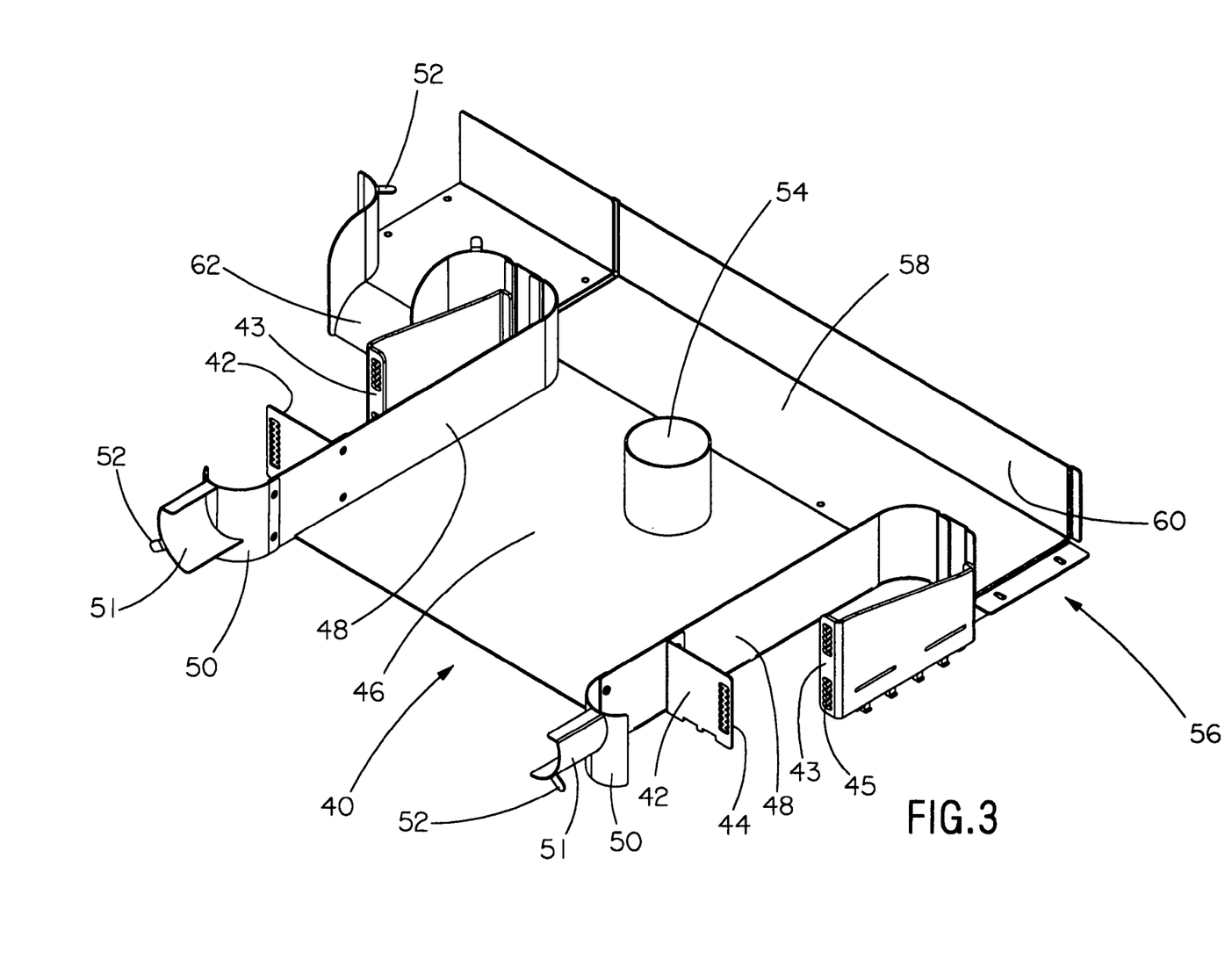
FIG. 3 is a pass-through tray in accordance with an embodiment of the invention.
Figure 4:
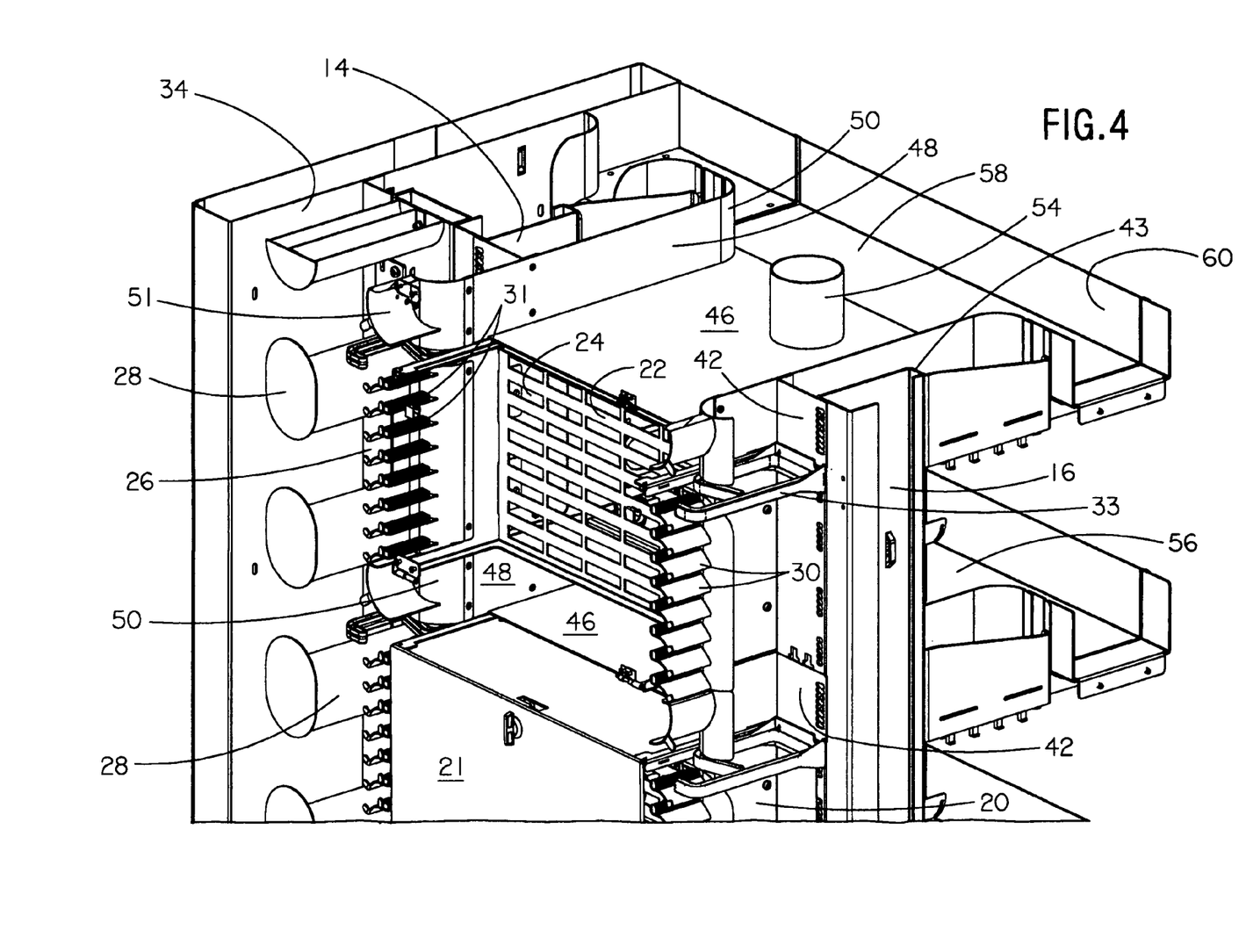
FIG. 4 is a partial front upper right perspective view of the rack of FIG. 1, wherein the rack has been cut away along the line 4-4 in FIG. 1.
Figure 5:
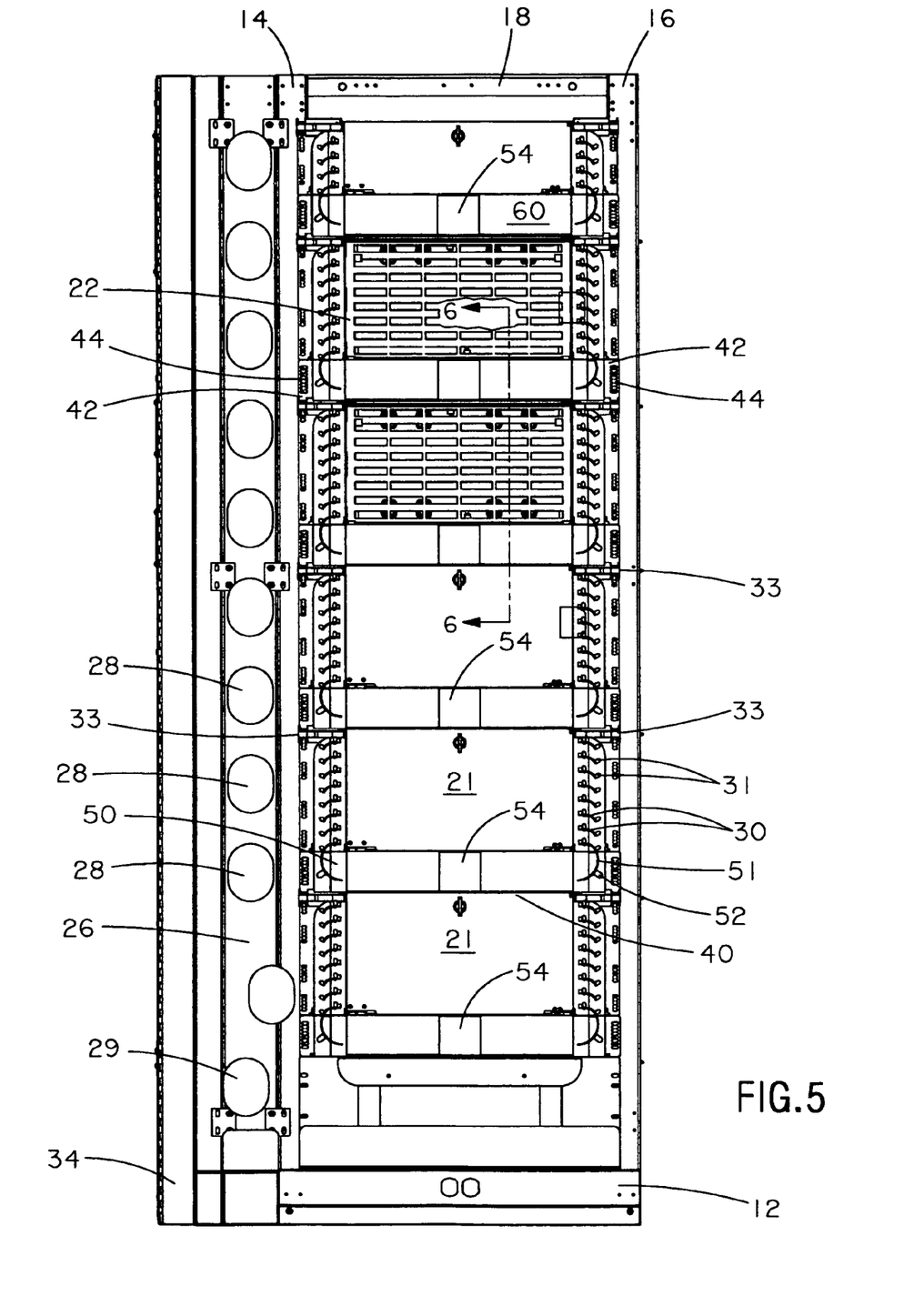
FIG. 5 is a front elevational view of a the rack of FIG. 1.
Figure 6:
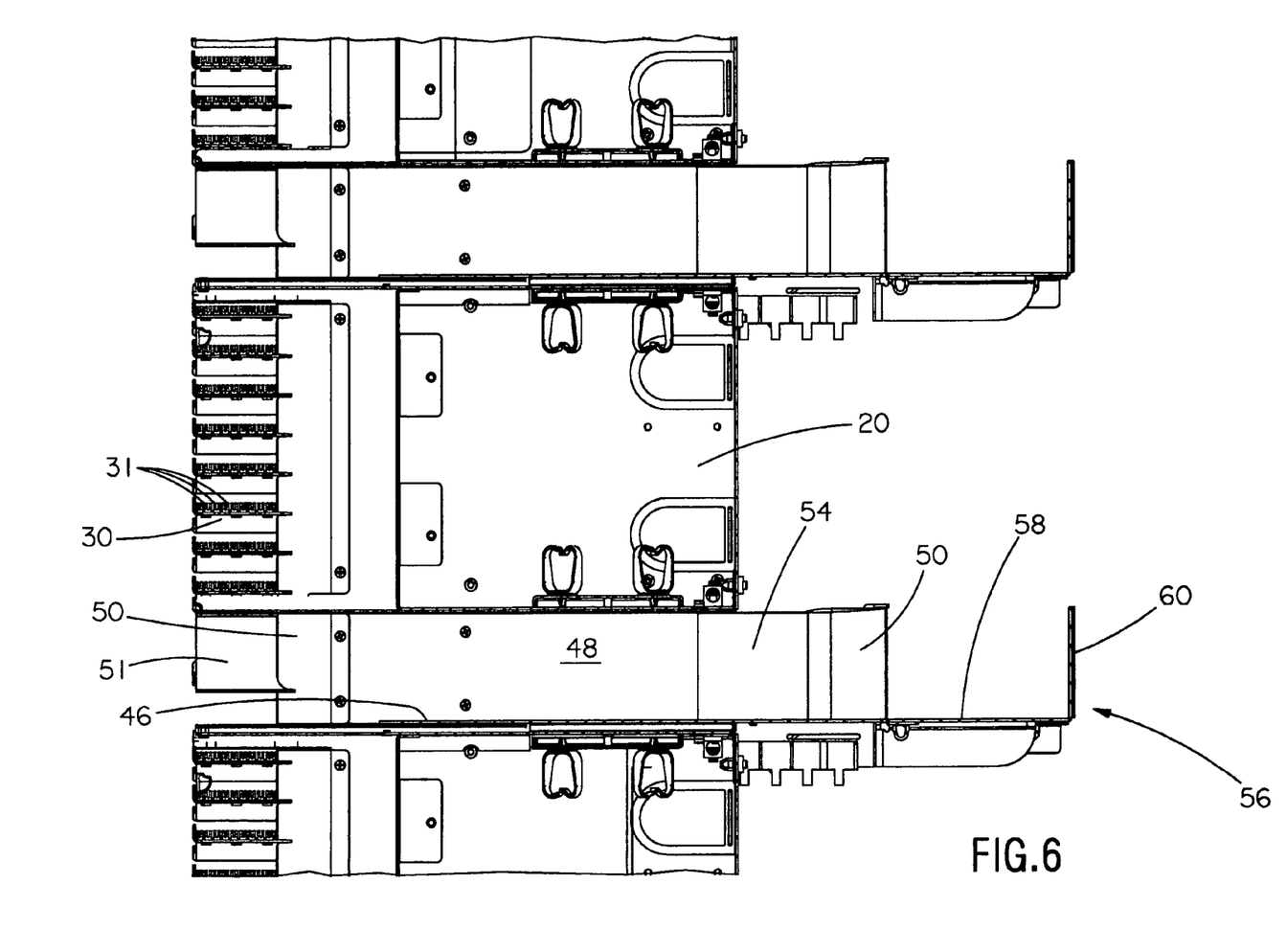
FIG. 6 is a partial side sectional view of the rack of FIG. 5, taken along the line 6-6 in FIG. 5.
Figure 7:
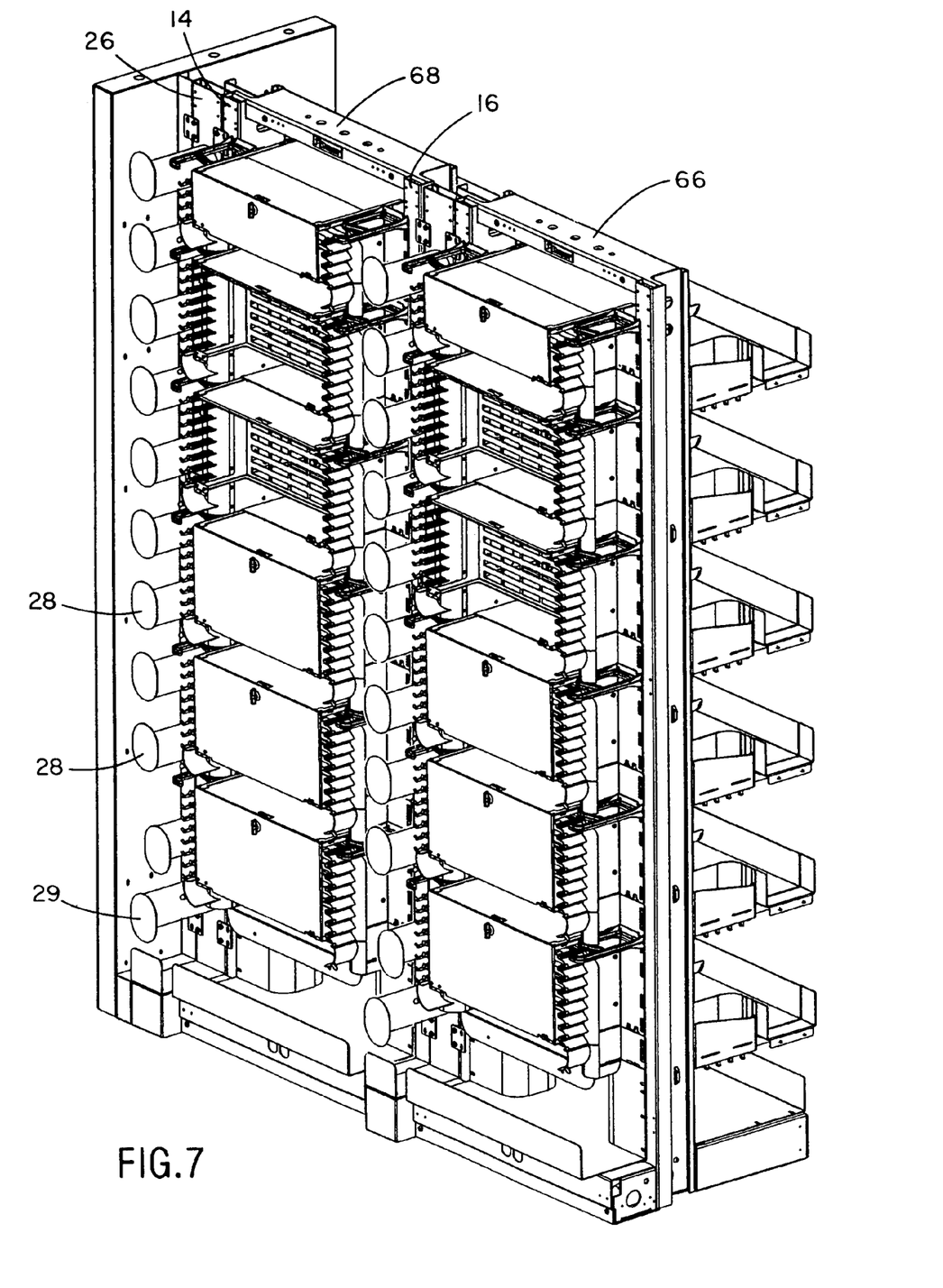
FIG. 7 is an upper right front perspective view of a pair of adjacent cable management racks (system) in accordance with an embodiment of the invention.
Figure 8:
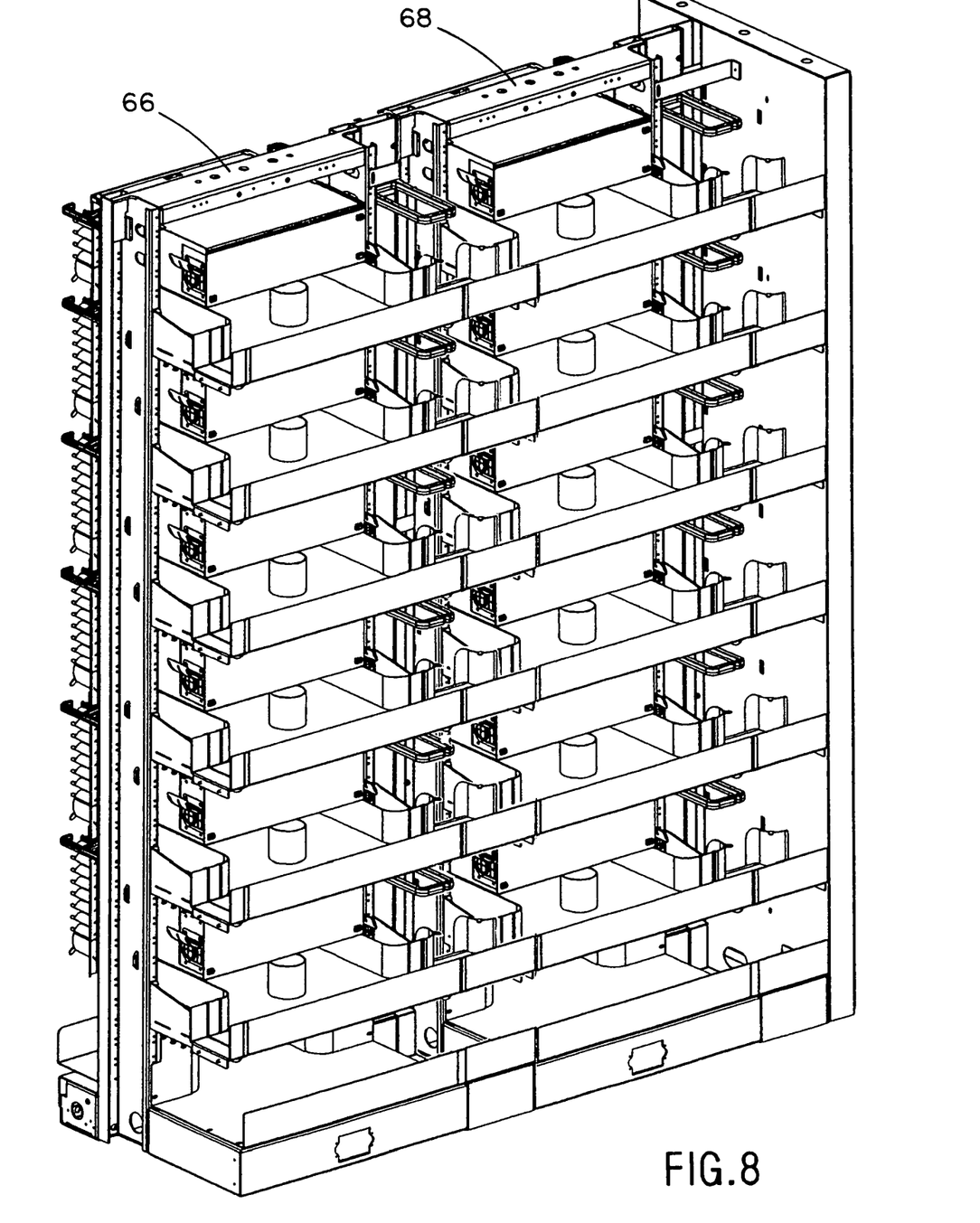
FIG. 8 is an upper right rear perspective view of the cable management racks (system) of FIG. 7.

A preferred embodiment of the tray 40, seen in detail in FIGS. 3, 4, and 6, preferably has mounting flanges 42 with mounting holes 44 that may be bolted or otherwise attached to similar holes on the front of vertical side rails 14 and 16 of the rack 10. The tray may also have secondary mounting flanges 43 with mounting holes 45 for mounting to the rear of the rails. The tray has a base 46 for supporting the cables passing through and a pair of side walls 48 upstanding from the base to retain the cables on the base 46. The side walls 48 preferably have bend radius control portions 50 that conform to Telecordia standards to adequately protect the fiber optic cables. The tray 40 also preferably has bend radius control extensions 51 extending from the side walls 48 for perpendicularly protecting the cables being routed to/from the fans 30. The tray may additionally include tabs 52 or other structure along the tops of the side walls 48 or elsewhere to help contain the cables within the tray. The tray also preferably includes a spool 54 for providing bend radius support to cables that are being routed through the tray and then into a rear channel 56 of the rack, wherein the routing through the rear channel is generally transverse to the routing through the tray. The rear channels 56 are preferably disposed at the rear of the trays at elevations prescribed by Telecordia standards. The rear channels preferably include a trough or flat portion 58 generally parallel with the base of the tray, and an upstanding rear/side wall 60.

The tray 40 may be integral with, or merely attached to, the rear channel 56. A primary advantage of the combination is that cables may be routed from one rack to another rack along connected rear channels rather than having to be routed downwardly to the base 12 of the rack 10 and then over to another rack. When all cables are routed downwardly to the base first, all the cables exiting and entering the rack are twice present in the base area of the rack. This yields massive cable congestion that makes nearly impossible even the tracing of a particular cable, even more so the rerouting of the cable or the reconfiguring of the network. Having the cables traveling rack-to-rack at different elevations, depending on the elevation of one of the associated patch panels or other electrical equipment, permits the mass of cables to be segregated by elevation, thus significantly reducing cable congestion of the system. Relative to some previous cable management rack configurations, it is believed that embodiments of the herein described racks, especially with the pass-through tray, more efficiently use the entirety of the 30×24 inch footprint provided in the Telecordia standards for cable routing and thus provides less congestion.

Figure 10:
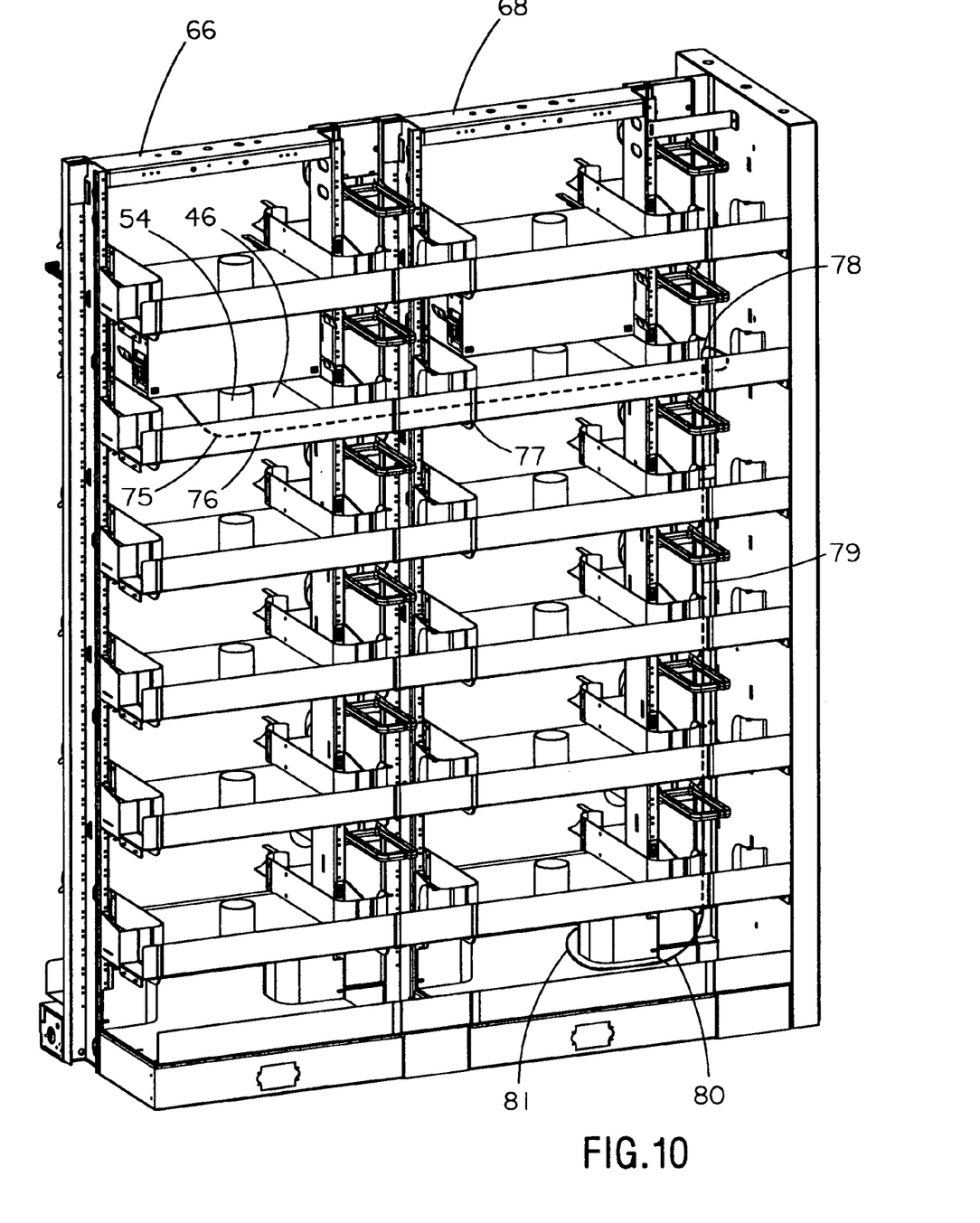
FIG. 10 is a view akin to FIG. 8 wherein a typical cable path is shown.

In a preferred embodiment of the invention, and as seen in FIGS. 9 and 10, a cable may take the following path from a first end plugged into a port on the front of a first rack 66 to a second end plugged into a port on the front of a second rack 68 that is in line with the first rack. The racks need not be adjacent, but must generally be aligned and facing in the same general direction. From its first end, the cable emerges 70 from the front of the first patch panel and is routed somewhat transversely 71 to a finger hole 31 on the bend radius surface of the fan 30 on the same side of the rack and at the same elevation as the port from which the cable emerges 70. Traveling past the finger hole 31, the cable is directed downwardly 72 by the fan 30 toward a pass-through tray 40 mounted directly below the patch panel on the first rack. The cable curves 73 around the bend radius extension 51, and with the bend radius control portions 50 of the curved side walls 48 preserving the bend radius of the cable, the cable extends rearwardly 74 through the pass-through tray, partially around 75 the upstanding spool 54 on the base 46 of the tray and transversely 76 into the trough portion 58 of the rear channel 56 at the rear of the first rack 66. The cable then travels through connected rear channels 77 at the same elevation on consecutively adjacent racks until it reaches its destination rack, the second rack 68. While the racks 66 and 68 may or may not be adjacent, in the embodiment shown in FIGS. 9 and 10 they are. Upon reaching the second rack, the cable is routed down 78 a waterfall portion 62 into the rear vertical pathway 79 (rear vertical elevator) defined by the D-rings 32 until the cable reaches 80 the base of the second rack 68. The cable travels 81 rear-to-front at the base before entering 82 the slack manager 26 on the front of the second rack. Depending on its amount of slack, the cable goes 83 up the slack manager, over 84 one of the spools 28 thereon, and back down 85 around 86 the bottom spool 29 on the slack manager into 87 either the left or right (right shown) front vertical channel on the front of the left and right vertical side rails 14 and 16, respectively. The vertical channels are preferably defined by D-rings 33 mounted on the side rails, and the cable is routed upwardly 88 to the elevation of the second patch panel before being routed somewhat transversely 89 through the appropriate finger hole 31 on the appropriate fan 30 adjacent the second patch panel. The cable is then routed into 90 the designated port on the patch panel on the front of the second rack.

Figure 11:
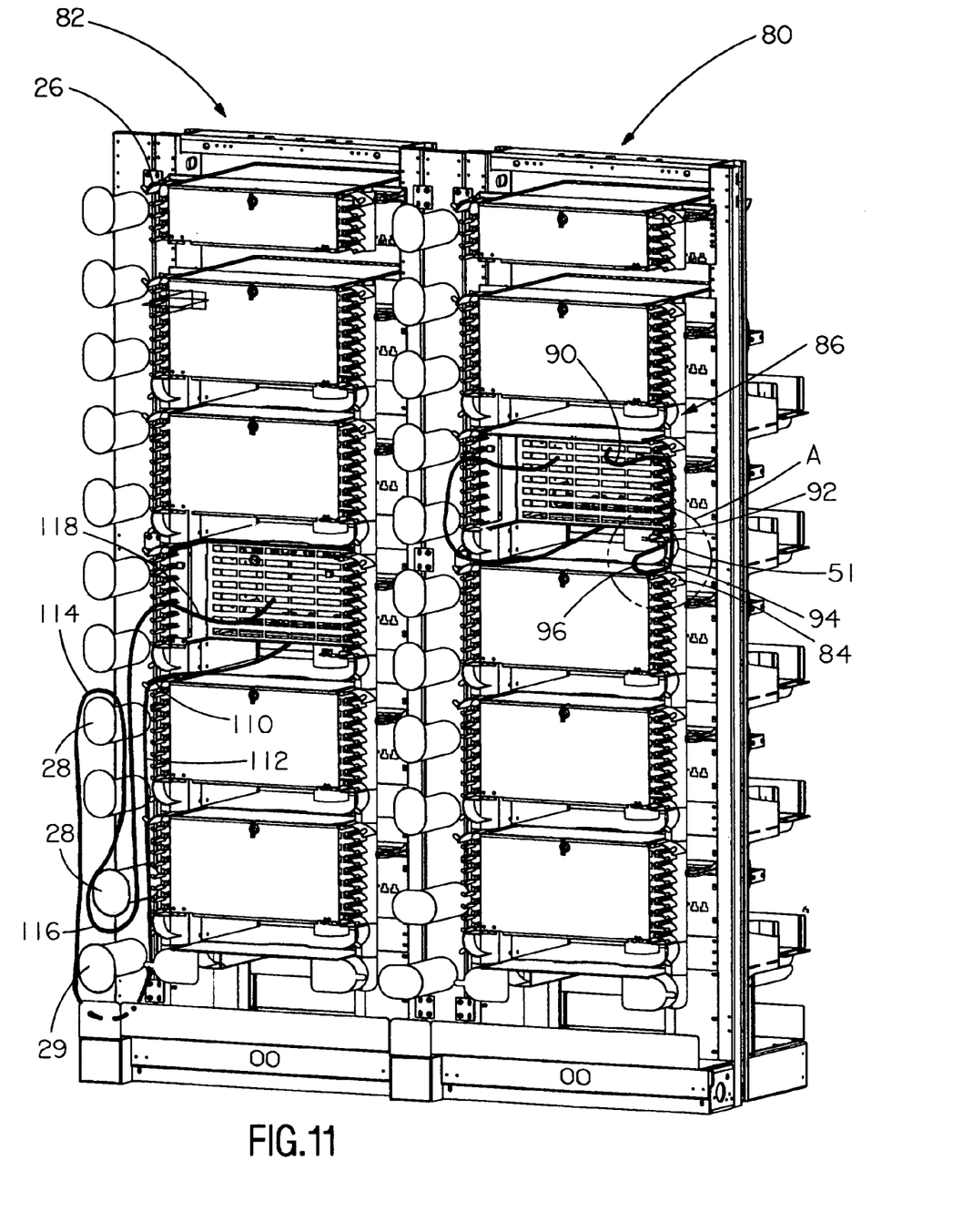
FIG. 11 is an upper right perspective view of a pair of adjacent cable management racks in accordance with another embodiment of the present invention showing a cable path.
Figure 12:
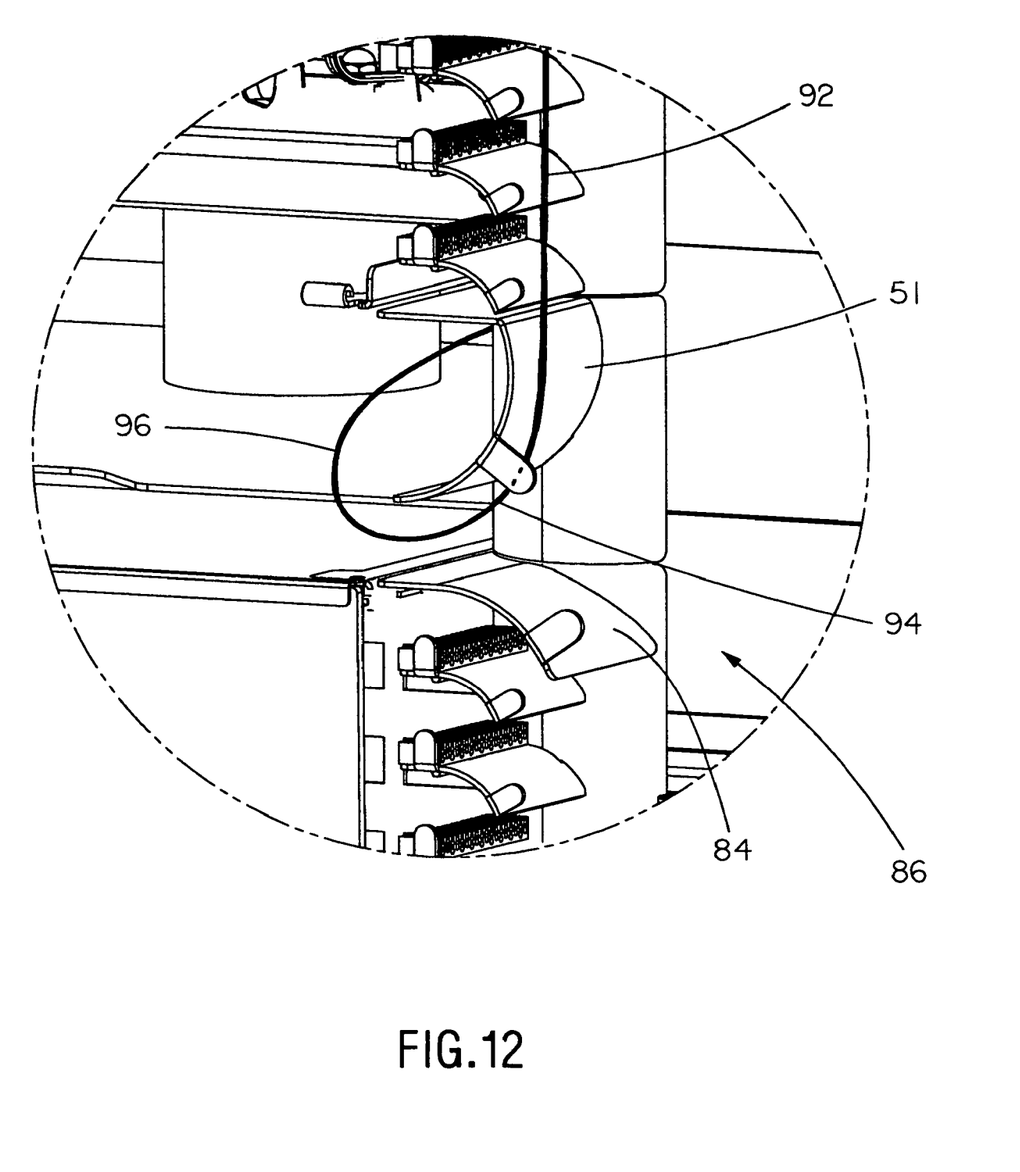
FIG. 12 is a detail view of the detail "A" of FIG. 11.
Figure 14:
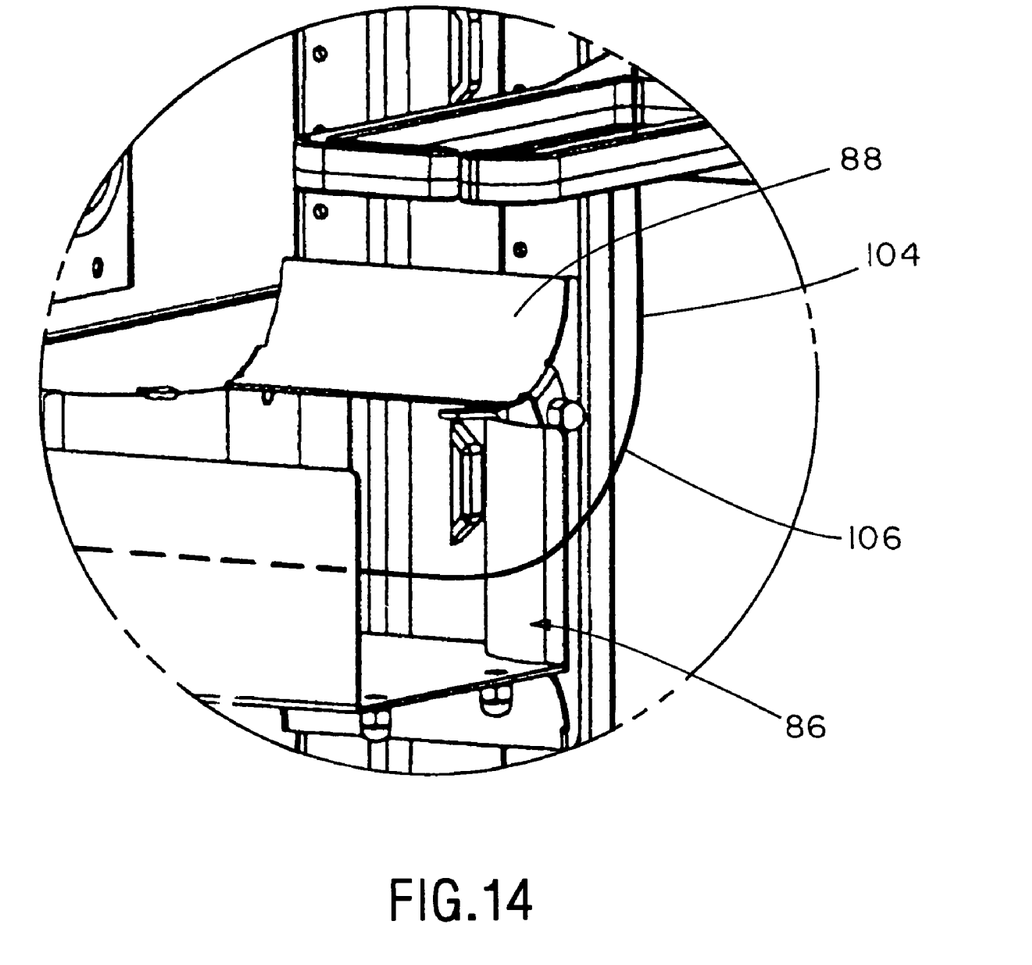
FIG. 14 is a detail view of the detail "B" of FIG. 13.

Turning now to FIG. 11, first and second racks 80 and 82 illustrate a cable path according to another embodiment of the present invention. The embodiment shown in FIG. 11 uses additional bend radius control extensions to facilitate routing of cable. According to one embodiment, downwardly curved front bend radius control extensions 84—as more clearly seen in FIG. 12, which is a detail view of the detail "A" of FIG. 11—are provided on rack-mountable pass-through trays 86. Additionally, upwardly curved rear bend radius control extensions 88 are provided on the rear of the pass-through trays 86, as seen in FIG. 14.

Figure 13:
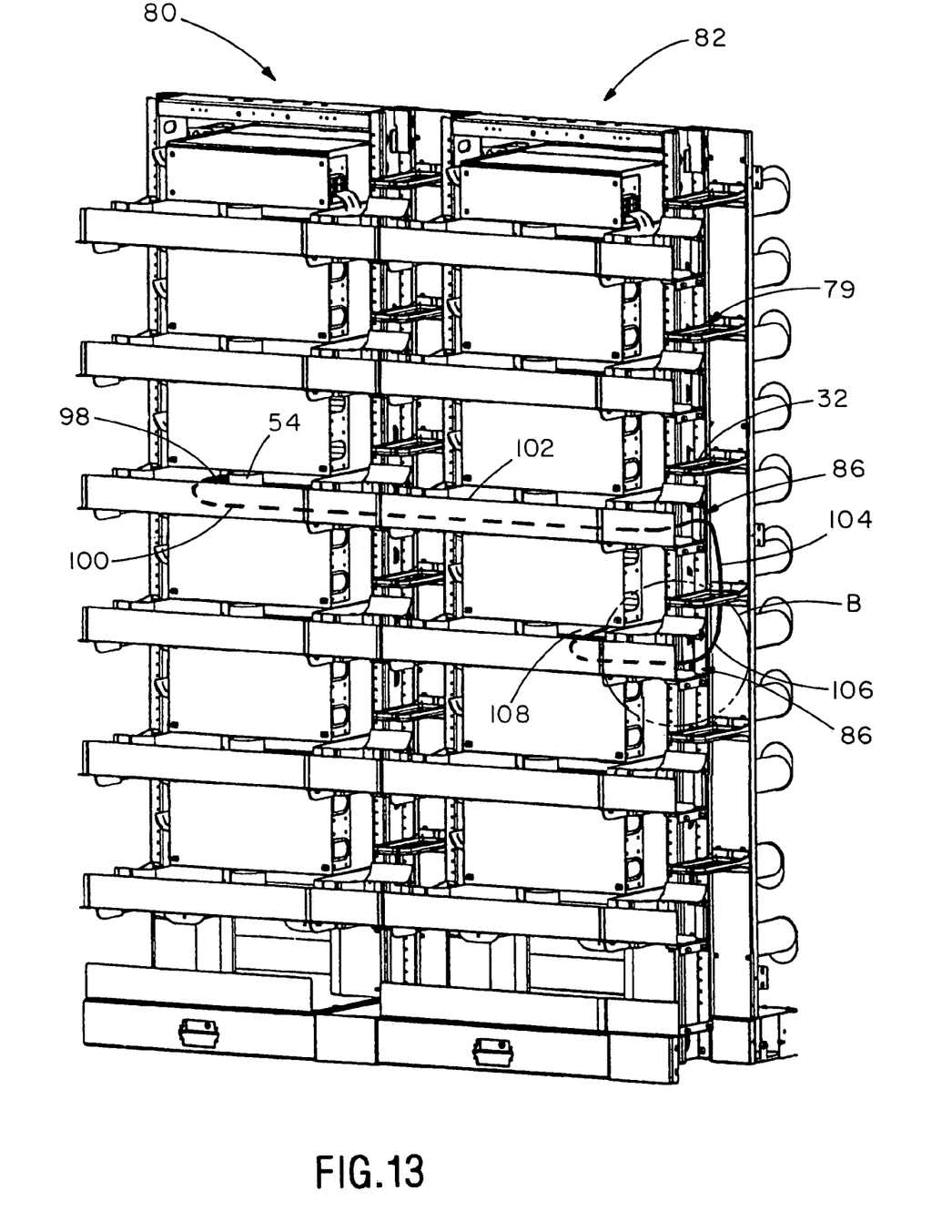
FIG. 13 is an upper left perspective view of the cable management racks of FIG. 11 showing a cable path.

A cable path for a cable having a first end plugged into a port on the front of the first rack 80 to a second end plugged into a port on the front of a second rack 82 that is in line with the first rack 80 will now be described with reference to FIGS. 11 and 13. The racks need not be adjacent, but must generally be aligned and facing in the same general direction. From its first end, the cable emerges 90 from the front of the first patch panel and is routed somewhat transversely to a finger hole 31 on the bend radius surface of the fan 30 on the same side of the rack and at the same elevation as the port from which the cable emerges 90. Traveling past the finger hole 31, the cable is directed downwardly 92 by the fan 30 toward a pass-through tray 86 mounted directly below the patch panel on the first rack. The cable curves 94 around the bend radius extension 51, and with the bend radius control portions 50 of curved side walls preserving the bend radius of the cable, the cable extends rearwardly 96 through the pass-through tray 86, partially around 98 the upstanding spool 54 on the base of the pass-through tray 86 and transversely 100 into the trough portion 58 of the rear channel 56 at the rear of the first rack 80. The cable then travels through connected rear channels 102 at the same elevation on consecutively adjacent racks until it reaches its destination rack, the second rack 82. While the racks 80 and 82 may or may not be adjacent, in the embodiment shown in FIGS. 11 and 13 they are. Upon reaching the second rack, in the cable path of FIGS. 11 and 13 the cable is routed down 104 a waterfall portion 62 into the rear vertical pathway 79 (rear vertical elevator) defined by the D-rings 32. The cable is routed to a pass-through tray 86 associated with the desired termination port by curving 106 around the upwardly curved rear bend radius control extension 86. It is to be understood that if the desired termination port on the second rack 82 is higher than the first termination port on the first rack 80, the cable will be routed upwardly in this step.

The cable passes 108 rear-to-front through the pass-through tray 86 beneath the desired termination port. Referring now to FIG. 11, the cable is routed downwardly 110 by the front bend radius control extension 84 and into the slack manager 26 on the front of the second rack 82. Depending on the amount of slack, the cable is routed down 112 the slack manager, beneath the bottom spool 29 and over 114 and under 116 the appropriate spools 28 on the slack manager 26 to adequately take up the slack in the cable. The cable is then routed up the slack manager to the appropriate finger hole 31 on the appropriate fan 30 adjacent the second patch panel. The cable is then routed 118 into the designated port on the patch panel on the front of the second rack 82.

It should be noted that the above-described and illustrated embodiments are exemplary only and in no way limit the scope of the invention. For example, a rack wherein a tray is mounted above, rather than below, a patch panel on the rack, yet still services cables emerging from the patch panel, is considered to be within the scope of the invention. Also, the orientation of the rack and equipment mounted thereon in the above embodiments should not be construed to limit the claims in any manner.

We claim:

1. A cable management rack for routing cables thereon, said rack having a front side and a rear side and said rack comprising:

a frame;

a frame-mountable pass-through tray disposed on said frame, said pass-through tray having a base and sidewalls defining a front-to-back channel in a center of the tray for routing said cables between said front side of said rack and said rear side of said rack, said pass-through tray including at least one upstanding spool disposed substantially at a center of said tray, a width of the front-to-back channel being substantially constant along a length of the front-to-back channel;

a rear channel adjacent to and extending substantially perpendicular to the front-to-back channel;

a slack manager having a plurality of spools at different elevations, the frame having a first vertical side rail to which the slack manager and tray are connected on opposite sides; and an end cap connected to the slack manager such that the end cap extends substantially parallel with the front-to-back channel and the slack manager is disposed between the end cap and the vertical side rail, wherein the rear channel has openings on opposing ends, the end cap terminating one of the openings.

2. A rack in accordance with claim 1 wherein a set of the spools are vertically aligned, at least one of the spools being out of alignment with the set of spools such that a distance between the at least one of the spools and the vertical side rail is different than a distance between the set of spools and the vertical side rail.

3. A rack in accordance with claim 2 wherein the at least one of the spools comprises the spool adjacent to a lowermost spool of the plurality of spools.

4. A rack in accordance with claim 2 wherein the at least one of the spools is more proximate to the vertical side rail than the set of spools.

5. A rack in accordance with claim 1 further comprising a bend radius control portion over the openings, the bend radius control portion curving downwardly and rearwardly.

6. A rack in accordance with claim 1 further comprising an second vertical side rail opposing the first side rail and wherein the rack contains a plurality of the trays, the rack further comprising a plurality of fans disposed on the front of the rack between adjacent trays generally aligned proximate and parallel to the first and second vertical side rails, adjacent fans separated by a substantially constant distance, the fans curving outward and downward.

7. A rack in accordance with claim 6 wherein the tray further comprises:
   bend radius control portions that curve outward from the sidewalls that form the front-to-back channel, and
   bend radius control extensions connected to the bend radius control portions, the bend radius control extensions curving downward and inward, the bend radius control extensions opposing uppermost fans of the plurality of fans and substantially contiguous with lowermost fans of the plurality of fans.

8. A rack in accordance with claim 6 wherein each fan comprises a bend radius control surface containing finger holes.

9. A rack in accordance with claim 6 further comprising enclosures mounted between adjacent trays and adapted to receive communication equipment therein.

10. A multiple-rack system of cable management racks for routing cables thereon and therebetween, said system including adjacent racks each having a front side and a rear side, each of said adjacent racks comprising:
   a frame;
   a frame-mountable pass-through tray disposed on said frame, said pass-through tray having a base and sidewalls defining a front-to-back channel in a center of the tray for routing said cables between said front side of said rack and said rear side of said rack, said tray including a rear channel adjacent to and extending substantially perpendicular to said front-to-back channel, said rear channel having openings on opposing ends, said rear channel containing a trough generally planar with and connected to said base and a rear wall on an opposite side of said trough as said base, said pass-through tray including at least one upstanding spool that is disposed at a center of said tray, a width of the front-to-back channel being substantially constant along a length of the front-to-back channel;
   wherein opposing openings of said rear channels of said trays of said adjacent racks are connected together such that said rear channels are contiguous; and
   wherein each adjacent rack further comprises a slack manager having a plurality of spools at different elevations, the frame of the rack having a first vertical side rail to which the slack manager of the rack and the tray of the rack are connected on opposite sides, and
   wherein the slack manager of a first of the adjacent racks is connected to a second of the adjacent racks such that the slack manager of the first of the adjacent racks is disposed between the adjacent racks; and
   an end cap connected to the slack manager of the second of the adjacent racks such that the end cap extends substantially parallel with the front-to-back channel of the second of the adjacent racks and the slack manager of the second of the adjacent racks is disposed between the end cap and the vertical side rail of the second of the adjacent racks, the end cap terminating one of the openings of the rear channel of the second of the adjacent racks.

11. A multiple-rack system in accordance with claim 10 wherein a set of the spools of each slack manager are vertically aligned, at least one of the spools being out of alignment with the set of spools such that a distance between the at least one of the spools of the rack and the vertical side rail of the rack is different than a distance between the set of spools of the rack and the vertical side rail of the rack.

12. A multiple-rack system in accordance with claim 11 wherein the at least one of the spools is more proximate to the vertical side rail than the set of spools.

13. A multiple-rack system in accordance with claim 11 wherein the at least one of the spools comprises the spool adjacent to a lowermost spool of the plurality of spools.

14. A multiple-rack system in accordance with claim 10 further comprising a second vertical side rail and wherein each adjacent rack contains a plurality of the trays, the rack further comprising a plurality of fans disposed on the front of the rack between adjacent trays generally aligned proximate and parallel to the first and second vertical side rails, adjacent fans separated by a substantially constant distance, the fans curving outward and downward.

15. A multiple-rack system in accordance with claim 14 wherein each fan comprises a bend radius control surface containing finger holes.

16. A multiple-rack system in accordance with claim 14 wherein the tray further comprises:
   bend radius control portions that curve outward from the sidewalls that form the front-to-back channel, and
   bend radius control extensions connected to the bend radius control portions, the bend radius control extensions curving downward and inward, the bend radius control extensions opposing uppermost fans of the plurality of fans and substantially contiguous with lowermost fans of the plurality of fans.

17. A multiple-rack system in accordance with claim 14 further comprising enclosures mounted between adjacent trays and adapted to receive communication equipment therein.

18. A multiple-rack system in accordance with claim 17 wherein each of the enclosures is disposed such that the enclosure overlaps a majority of the base of the front-to-back channel.

19. A multiple-rack system in accordance with claim 10 further comprising a bend radius control portion over each opening, the bend radius control portion curving downwardly and rearwardly.

* * * * *